(12) United States Patent
Oh et al.

(10) Patent No.: US 7,993,961 B2
(45) Date of Patent: Aug. 9, 2011

(54) LAYOUT STRUCTURE IN SEMICONDUCTOR MEMORY DEVICE COMPRISING GLOBAL WORD LINES, LOCAL WORD LINES, GLOBAL BIT LINES AND LOCAL BIT LINES

(75) Inventors: Hyung-Rok Oh, Seongnam-si (KR); Sang-Beom Kang, Hwaseong-si (KR); Du-Eung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/509,617

(22) Filed: Jul. 27, 2009

(65) Prior Publication Data

US 2009/0291522 A1   Nov. 26, 2009

Related U.S. Application Data

(62) Division of application No. 11/316,871, filed on Dec. 27, 2005, now Pat. No. 7,589,367.

(30) Foreign Application Priority Data

Apr. 8, 2005 (KR) .................. 10-2005-0029369

(51) Int. Cl.
*H01L 21/06* (2006.01)

(52) U.S. Cl. ....... 438/102; 438/587; 438/128; 438/109; 257/E21.068; 257/E23.029; 257/246

(58) Field of Classification Search .................. 257/246, 257/248, E31.029, 296, E21.068; 438/102, 438/587, 128, 109
See application file for complete search history.

(56) References Cited

U.S. PATENT DOCUMENTS

| | | | |
|---|---|---|---|
| 5,748,545 A | 5/1998 | Lee et al. | |
| 6,069,815 A | 5/2000 | Mueller et al. | |
| 6,437,383 B1 | 8/2002 | Xu | |
| 6,760,017 B1 | 7/2004 | Banerjee et al. | |
| 7,251,157 B2 * | 7/2007 | Osada et al. ............ | 365/163 |
| 2001/0002882 A1 | 6/2001 | Shimazaki et al. | |
| 2002/0154562 A1 | 10/2002 | Endo et al. | |
| 2004/0165424 A1 * | 8/2004 | Tsang .................... | 365/171 |

* cited by examiner

*Primary Examiner* — Bradley K Smith
*Assistant Examiner* — Mohammad T Karimy
(74) *Attorney, Agent, or Firm* — Volentine & Whitt, PLLC (57) ABSTRACT

A line layout structure and method in a semiconductor memory device having a hierarchical structure are provided. In a semiconductor memory device having a global word line and a local word line, and a global bit line and a local bit line, and individually disposing all of the global word line, the local word line, the global bit line and the local bit line at conductive layers among at least three layers; at least two of the global word line, the local word line, the global bit line and the local bit line are together disposed in parallel on one conductive layer. Signal lines constituting a semiconductor memory device are disposed in a hierarchical structure, whereby a semiconductor memory device advantageously having high integration, high speed and high performance may be obtained.

7 Claims, 10 Drawing Sheets

LAYOUT STRUCTURE IN SEMICONDUCTOR MEMORY DEVICE COMPRISING GLOBAL WORD LINES, LOCAL WORD LINES, GLOBAL BIT LINES AND LOCAL BIT LINES

CROSS-REFERENCE TO RELATED APPLICATION

This is a divisional of application Ser. No. 11/316,871 filed on Dec. 27, 2005, which is incorporated herein by reference in its entirety.

BACKGROUND OF THE INVENTION

1. Field of the Invention

The present invention relates to a semiconductor memory device, and more particularly, to a layout structure for a semiconductor memory device having a hierarchical structure and a layout method therefor.

A claim of priority under 35 U.S.C. §119 is made to Korean Patent Application 10-2005-29369, filed on Apr. 8, 2005, the content of which is hereby incorporated by reference in its entirety.

2. Description of the Related Art

In general, as semiconductor device integration has recently improved, the number of memory cells per semiconductor device has increased and the size of memory cells has been reduced. Consequently, the length and the number of word lines and bit lines connected with the memory cells has also increased. Such an increase causes word line and bit line capacitance to increase, which consequently increases power consumption and reduces operation speed of semiconductor memory devices. Thus, for 64M DRAM and 256M DRAM, a hierarchical concept has been introduced for layout of circuits and wires, in view of the recognition that high speed operation and a low power consumption are restricted by chip size increase in a conventional structure of word lines and bit lines.

In a semiconductor memory device having a general hierarchical structure, a global bit line (or a main bit line or master bit line), a local bit line (or a sub bit line or slave bit line), a global word line (or main word line) and a local word line (or sub word line) etc., are disposed at different conductive layers. In particular, an example of hierarchical structure of bit lines and/or word lines for a DRAM (Dynamic Random Access Memory) is disclosed in U.S. Pat. No. 6,069,815.

Meanwhile, as another approach to realize high performance and low power consumption, next-generation memory devices are being developed that do not have refresh operations, in contrast to semiconductor memory devices such as volatile DRAM. An example of such a next-generation memory device is a PRAM (Phase change Random Access Memory), which uses phase change material. A phase change material such as chalcogenide has a resistance that changes responsive to phase change of the material caused by temperature. For example, $Ge_xSb_yTe_z$ (hereinafter, referred to as 'GST') as an alloy of Ge (germanium), Sb (antimony) and Te (tellurium) is generally used as a phase change material. The phase change material is useful in semiconductor memory devices, because the phase thereof can be rapidly changed to an amorphous state or a crystalline state by temperature. The phase change material has a high resistance in an amorphous state, and has a low resistance in a crystalline state, whereby the amorphous state of the phase change material is defined as a 'reset' or logic '1' state, and the crystalline state is defined as a 'set' or logic '0' state. However, the states may be defined vice-versa when applied to semiconductor memory devices.

Memory cells constituting the PRAM described above may be formed as either a transistor structure and a diode structure. The transistor structure is a memory cell structure wherein the phase change material is connected to an access transistor in series. The diode structure is a memory cell structure wherein the phase change material is connected to a diode in series. Examples of PRAM employing memory cells of the transistor structure and the diode structure are disclosed in U.S. Pat. No. 6,760,017.

In a memory cell structure, a PRAM employing a diode structure can have a large write current that increases exponentially applied thereto as a function of voltage, as compared to a PRAM employing a transistor structure. By using a diode structure which is generally smaller than a transistor structure, a merit of flexibility for size reduction of memory cells and the overall chip is realized. Accordingly, in a semiconductor memory device requiring high integration, high-speed and low-power consumption, the use of PRAM employing memory cells of diode structure is expected to increase.

Figure 1:
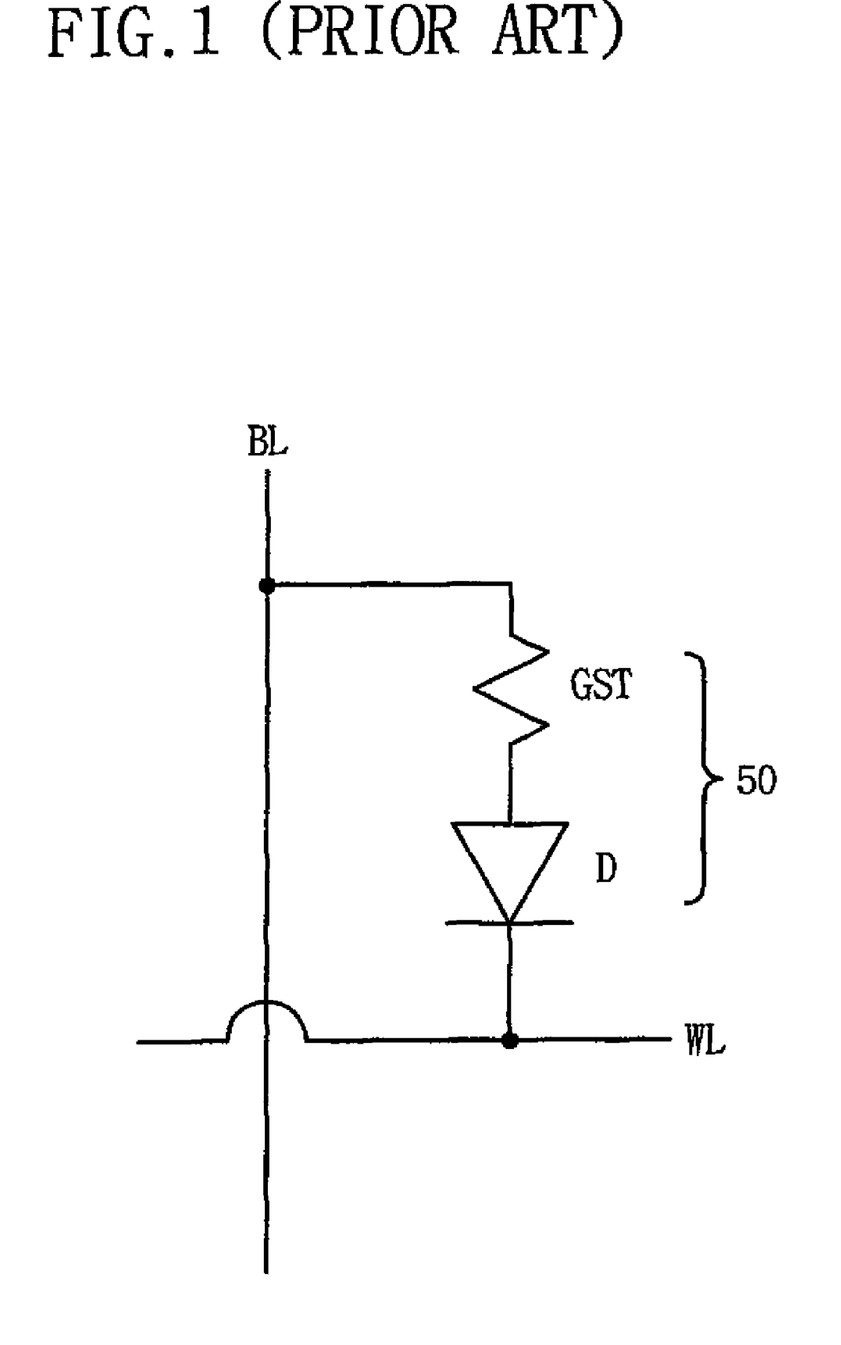
FIG. 1 illustrates a memory cell structure in a PRAM having a general diode structure.

FIG. 1 illustrates a general PRAM memory cell structure having a diode structure. Referring to FIG. 1, a memory cell 50 of the PRAM is constructed of one diode D and one variable resistant element GST, wherein the variable resistant element GST is formed of phase change material as described above. The diode D of the memory cell 50 is connected between a word line WL and the variable resistant element GST, and has a cathode terminal connected to the word line WL and an anode terminal connected to one end of the variable resistant element GST. Another end of the variable resistant element GST is connected to a bit line BL.

In a semiconductor memory device having such a structure and employing memory cells of the diode structure, the variable resistant element GST is used as a data storage element. A write operation is performed by using a reversible characteristic of the variable resistant element GST based on magnitude of current and voltage source applied to memory cells through the bit line BL. To perform the write operation in memory cell 50, current is supplied through the bit line BL. The word line WL is transited to a low level or ground level, so that a forward bias is applied to the diode D, forming a current path along a direction from the bit line BL to the word line WL. At this time, a phase change occurs in the variable resistant element GST connected to the anode terminal of the diode D, to thus place the variable resistant element GST in a 'set' state of low resistance or a 'reset' state of high resistance.

During a read operation, data stored in the variable resistant element GST is determined by the volume of current flowing through memory cells as responsive to the memory cell being in the 'set' or 'reset' state. In other words, when the variable resistant element GST within a memory cell is in a 'reset' state, the memory cell has a high resistance value, thus current of little volume flows from bit line BL having a given level. When the variable resistant element GST has a 'set' state, the memory cell has a low resistance value, and relatively higher current of greater volume flows.

A PRAM having memory cells of diode structure offer increasingly high integration and performance, with low-power consumption. Accordingly, it is expected that a hierarchical concept be necessarily introduced to a layout of wires formed on memory cells in the PRAM of the diode structure. In such a hierarchical structure, bit lines BL and word lines WL are hierarchically disposed in the configuration of memory cells having the same size as described above, thereby obtaining smaller size chips and providing an advantage of high performance.

In a PRAM having memory cells of transistor structure, the structure is similar to a structure of general DRAM, except that the storage element is a variable resistant element. Thus, a hierarchical wire layout for PRAM of transistor structure is equal or similar to that of DRAM. In contrast, in a PRAM having memory cells of diode structure, the memory cell structure is definitely different from DRAM, and thus a correspondingly appropriate hierarchical layout of wires should be developed.

SUMMARY OF THE INVENTION

Accordingly, an object of the present invention is to provide a layout structure and layout method in a semiconductor memory device, which are appropriate for high integration, high performance and low power consumption. The layout structure and layout method for a semiconductor memory device having a hierarchical structure are provided, so that simplification of processing can be obtained.

According to one aspect of the invention, a line layout structure in a semiconductor memory device having a global word line and a local word line, and a global bit line and a local bit line, includes individually disposing all of the global word line, the local word line, the global bit line and the local bit line as conductive layers among at least three layers, wherein at least two of the global word line, the local word line, the global bit line and the local bit line are together disposed in parallel at one optional conductive layer.

A memory cell constituting the semiconductor memory device can include one diode formed on an active region, and one variable resistant element connected to the diode through a contact. A cathode region of the diode can be connected to the active region, and an anode region can be connected to the variable resistant element.

The local bit line can be disposed at a first conductive layer as a lowermost layer among the conductive layers, extending lengthwise in a first direction and coupled with the variable resistant element of the memory cell through a contact. The local word line can be disposed at a second conductive layer as above the first conductive layer, extending lengthwise in a second direction that intersects with the first direction and coupled with the active region through a contact. The global word line can be disposed at the second conductive layer, in parallel with and distanced from the local word line. The global bit line can be disposed at a third conductive layer among the conductive layers above the second conductive layer and extending lengthwise in the first direction.

In the alternative, the local bit line can be disposed at a first conductive layer as a lowermost layer among the conductive layers, extending lengthwise in a first direction and coupled with the variable resistant element of the memory cell through a contact. The global bit line can be disposed at the first conductive layer, in parallel with and distanced from the local bit line. The local word line can be disposed at a second conductive layer among the conductive layers as above the first conductive layer, extending lengthwise in a second direction that intersects with the first direction and coupled with the active region through a contact. The global word line can be disposed at a third conductive layer among the conductive layers and above the second conductive layer and extending lengthwise in the second direction.

According to another aspect of the invention, a semiconductor memory device having a plurality of memory cells is formed on active regions that are arrayed apart from each by a determined interval, and includes a plurality of local bit lines arrayed separated apart from each other by a determined interval and extending lengthwise in a first direction at a first conductive layer provided above the memory cells; a plurality of local word lines arrayed separated apart from each other and extending lengthwise in a second direction that intersects with the first direction, at a second conductive layer provided above the first conductive layer, the local word lines being respectively connected with the active regions through respective contacts; a plurality of global word lines apart spaced from the local word lines and extending lengthwise in the second direction at the second conductive layer, at least one of the global word lines is disposed every set number of local word lines; and a plurality of global bit lines arrayed spaced apart from each other by an interval and extending lengthwise in the first direction at a third conductive layer provided above the second conductive layer.

The semiconductor memory device can further include a plurality of dummy cells having a same structure as the memory cells. At least one of the dummy cells is disposed every set number of memory cells in the first direction. The dummy cells are arrayed adjacent each other in the second direction, and the global bit lines are vertically superimposed over the dummy cells. The global bit lines may be provided fewer in number than that of the local bit lines. One global bit line may be disposed being vertically superimposed over one of local bit lines every set number of the local bit lines.

According to another aspect of the invention, a semiconductor memory device having a plurality of memory cells formed on active regions that are arrayed apart from each other by an interval, includes a plurality of local bit lines that are arrayed as being spaced apart from each other and extending lengthwise in a first direction at a first conductive layer provided above the memory cells; a plurality of global bit lines which are arrayed as spaced apart from the local bit lines and extending lengthwise in a first direction, at least one of the global bit lines being disposed every set number of local bit lines at a first conductive layer; a plurality of local word lines that are arrayed spaced apart from each other by an interval and extending lengthwise in a second direction that intersects with the first direction, at a second conductive layer provided above the first conductive layer, the plurality of local word lines being respectively connected with the active region through respective contacts; and a plurality of global word lines that are arrayed spaced apart from each other by an interval and extending lengthwise in the second direction, at a third conductive layer provided above the second conductive layer.

The semiconductor memory device may further include a plurality of dummy cells that have the same structure as the memory cells and are arrayed adjacent each other in the first direction. At least one of the dummy cells is disposed every set number of memory cells in the second direction. The plurality of global bit lines are vertically superimposed over the plurality of dummy cells.

The global word lines may be provided fewer in number than that of the local word lines. One global word line may be vertically superimposed over one of the local word lines every set number of the local word lines.

According to another aspect of the invention, a layout method in a semiconductor memory device includes disposing a plurality of memory cells and dummy cells having a same structure, with a layout of at least one of the dummy cells every set number of memory cells on active regions that are arrayed spaced apart from each other by an interval on a semiconductor substrate; and disposing all of global word lines, local word lines, global bit lines and local bit lines as conductive layers among at least three layers above the memory cells and dummy cells, wherein at least two of all the global word lines, all the local word lines, all the global bit lines and all the local bit lines are together disposed in parallel at one of the conductive layers.

The disposing of the memory and dummy cells may include disposing diodes coupled to and on the active regions, with an interval therebetween; and respectively disposing variable resistant elements coupled to and on the diodes through contacts. The disposing of the global and local word lines and bit lines may include arraying local bit lines spaced apart from each other by an interval and extending lengthwise in a first direction at a first conductive layer as a lowermost layer of the conductive layers; arraying the local word lines and the global word lines parallel and separated from each other by an interval, the local word lines extending lengthwise in a second direction that intersects with the first direction at a second conductive layer provided above the first conductive layer, at least one of the global word lines being disposed every set number of local word lines; and arraying the global bit lines extending lengthwise in the first direction and separated from each other by an interval at a third conductive layer provided above the second conductive layer. The global bit lines are provided fewer in number than that of the local bit lines. One global bit line may be vertically superimposed over one of local bit lines every number set of the local bit lines, and the local bit lines may be respectively connected with and vertically superimposed over the variable resistant elements through respective contacts. The local word lines may be respectively connected with and vertically superimposed over the active regions through respective contacts. The global word lines may be respectively arranged vertically superimposed over the dummy cells.

Disposing of the global and local word lines and bit lines may include arraying the local bit lines and the global bit lines parallel and spaced apart from each other by an interval, the local bit lines extending lengthwise in a first direction at a lowermost layer of the conductive layers, at least one of the global bit lines being disposed every set number of the local bit lines; arraying the local word lines apart from each other by an interval and extending lengthwise in a second direction that intersects with the first direction at a second conductive layer provided above the first conductive layer; and arraying global word lines spaced apart from each other by an interval and extending lengthwise in the second direction at a third conductive layer provided above the second conductive layer. Further, the global word lines may be provided fewer in number than that of the local word lines. One global word line may be disposed as vertically superimposed over one of the local word lines every set number of the local word lines. The local bit lines may be respectively coupled with and vertically superimposed over the variable resistant elements through respective contacts. The local word lines may be respectively coupled with and vertically superimposed over the active regions through respective contacts. The global bit lines may be respectively arrayed as vertically superimposed over the dummy cells.

Such configuration as noted above provides a semiconductor memory device having a hierarchical structure with a high integration, high speed and high performance.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 10 is a circuit diagram of an equivalent circuit of a semiconductor memory device to which FIGS. 2 to 9 are applied.

DETAILED DESCRIPTION OF PREFERRED EMBODIMENTS

Hereinafter, exemplary embodiments of the present invention will be described in detail with reference to FIGS. 2-10. It will be understood by those skilled in the art that the present invention can be embodied in numerous different manners and is not limited to the following described embodiments. The following various embodiments are exemplary in nature.

Figure 2:
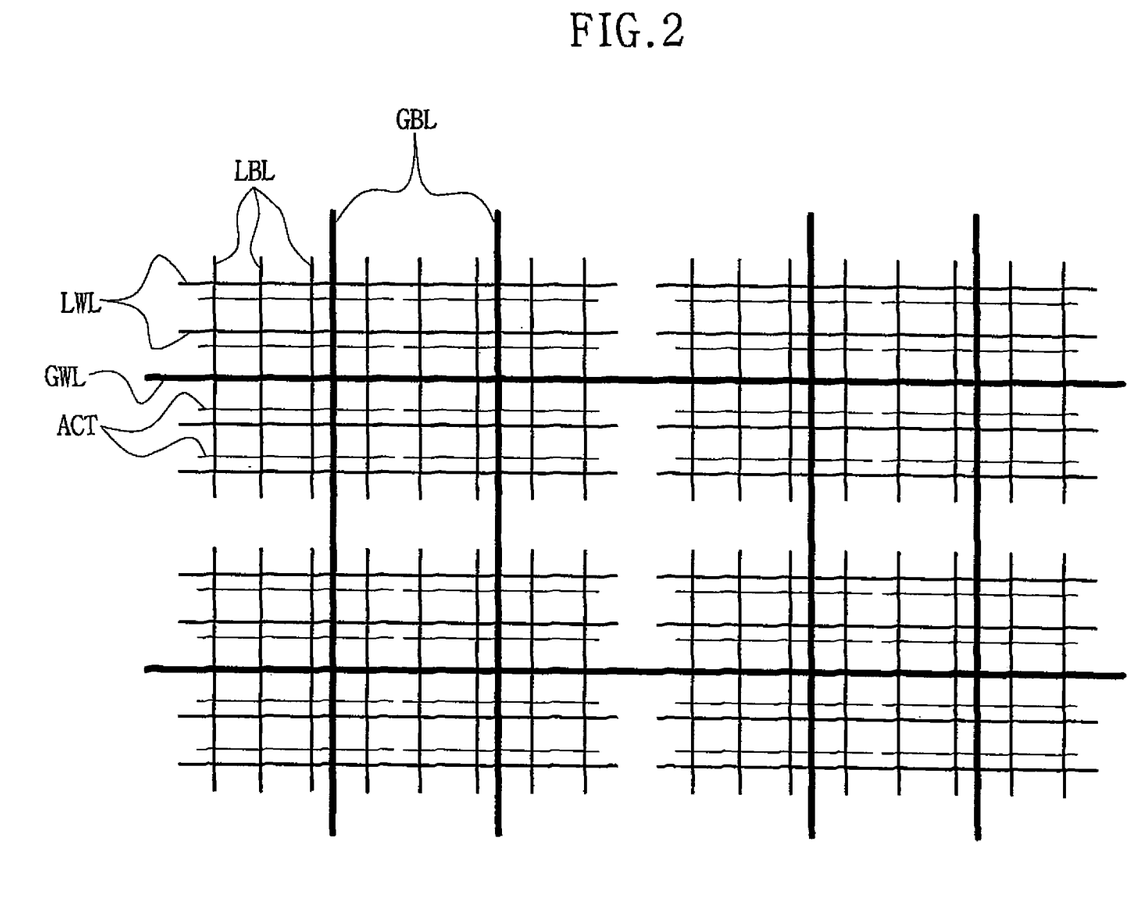
FIG. 2 illustrates a layout of a semiconductor memory device according to one exemplary embodiment of the invention.

FIG. 2 illustrates a layout of semiconductor memory device according to one exemplary embodiment of the invention. FIG. 2 illustrates only a layout of signal lines disposed in the upper part of a memory cell, in order to represent in detail a layout structure of the lines. In case signal lines are actually mutually superimposed, the drawing shows them as having mutually adjacent shape for distinction.

As shown in FIG. 2, according to one exemplary embodiment of the invention, global word lines GWL, local word lines LWL, global bit lines GBL and local bit lines LBL constitute a semiconductor memory device. The word lines including the global word lines GWL and the local word lines LWL are row lines. The bit lines including the global bit lines GBL and the local bit lines LBL are column lines. The word lines GWL and LWL, and the bit lines GBL and LBL, are arrayed as intersecting with each other.

The word lines including the global word lines GWL and the local word lines LWL, and the bit lines including the global bit lines GBL and the local bit lines LBL, are all positioned individually as conductive layers on at least three layers. That is, the lines are disposed at least among three different conductive layers. At one of the conductive layers, the word lines GWL and LWL are disposed together in parallel. In other words, global word lines GWL and local word lines LWL are disposed together at one conductive layer provided on active regions ACT that constitute a semiconductor substrate. The local bit lines LBL and the global bit lines GBL are disposed at conductive layers other than the one conductive layer.

Figure 3:
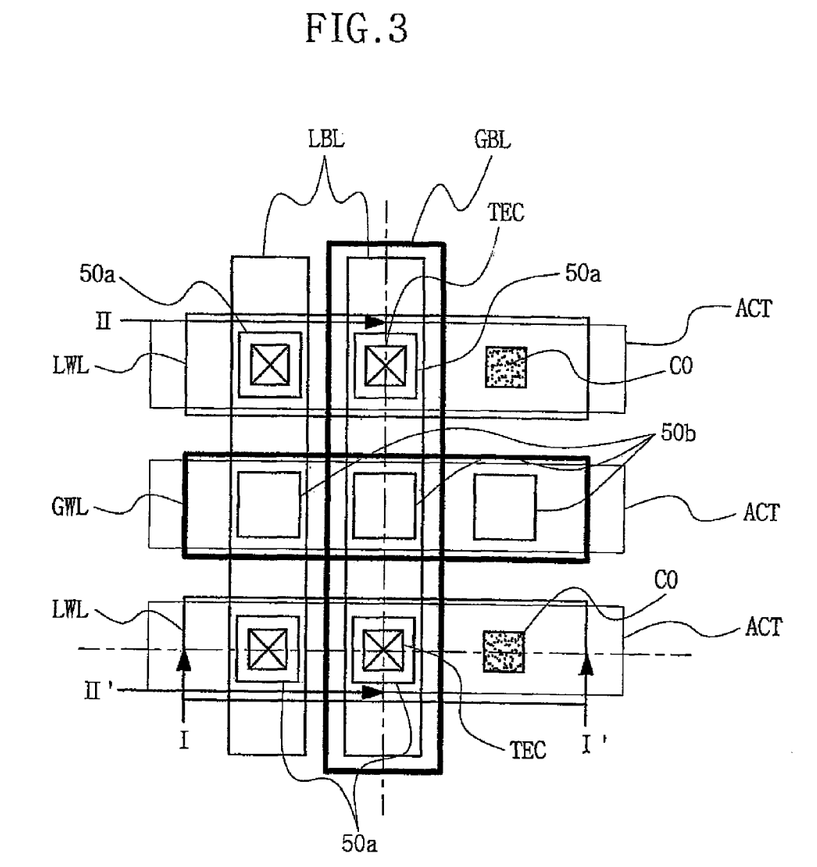
FIG. 3 is a partially enlarged view of FIG. 2.
Figure 4:
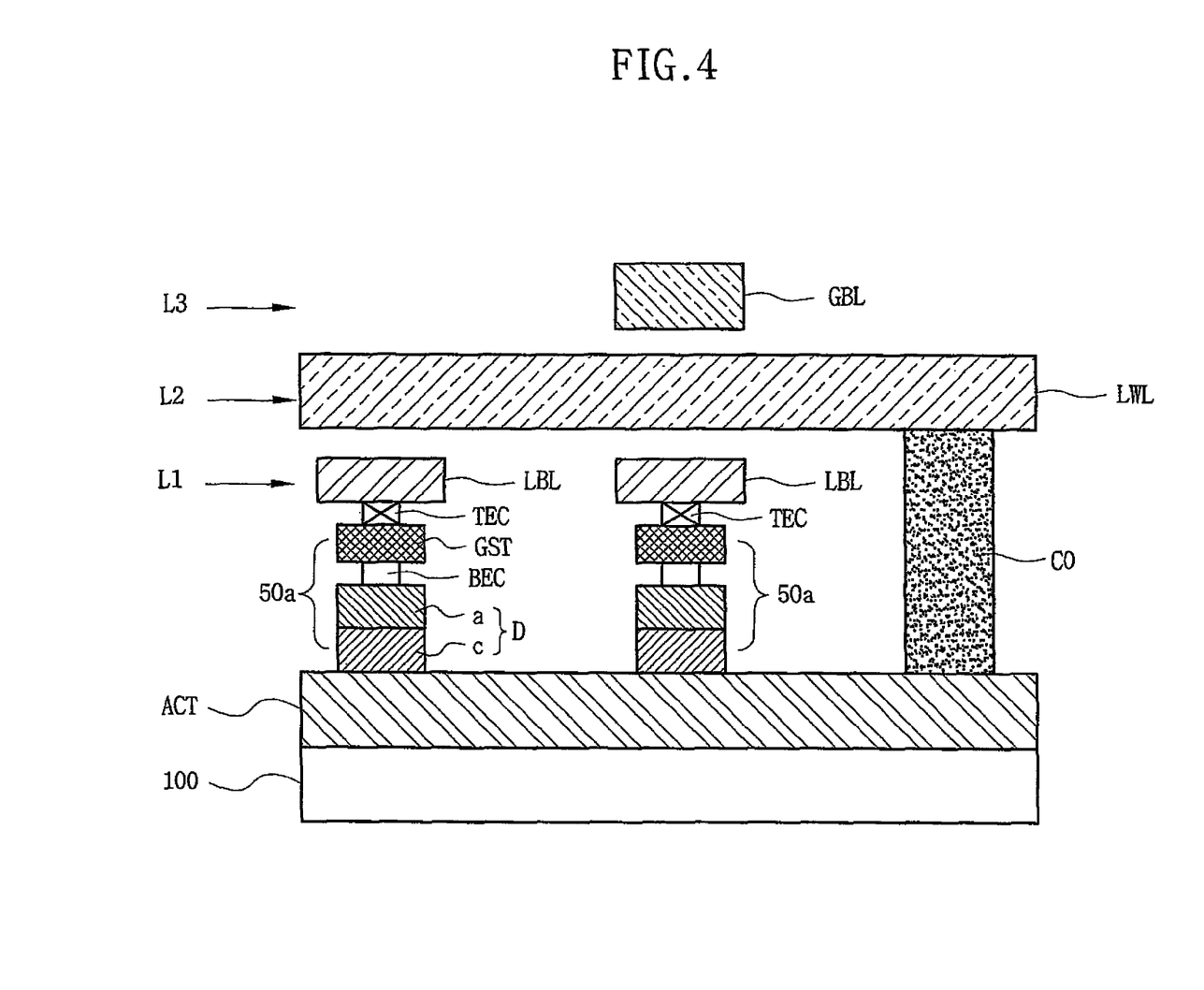
FIG. 4 is a cross-sectional view taken along line I-I' of FIG. 3.
Figure 5:
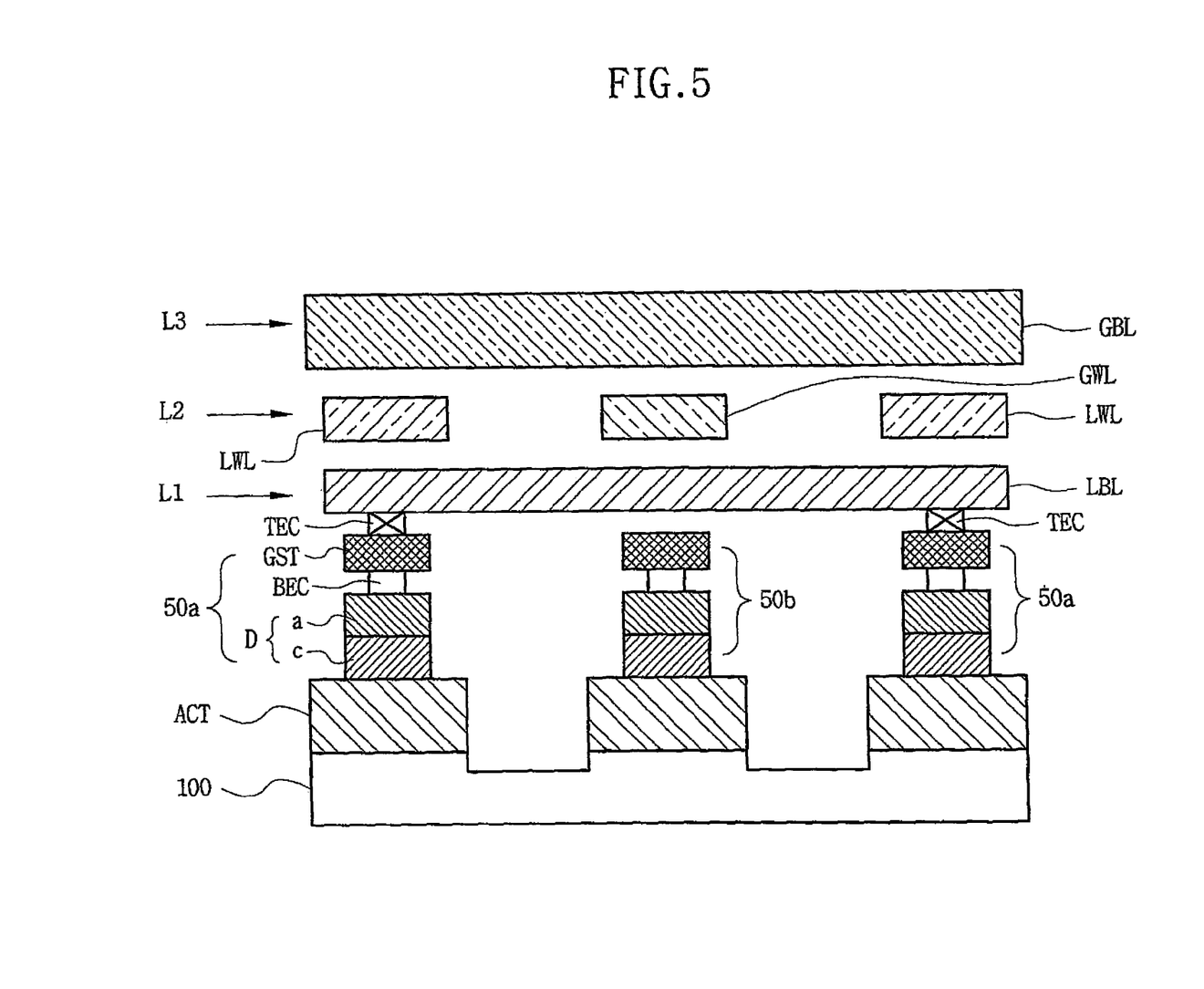
FIG. 5 is a cross-sectional view taken along line II-II' of FIG. 3.

FIG. 3 is a partially enlarged view of FIG. 2, FIG. 4 is a cross-sectional view taken along line I-I' of FIG. 3, and FIG. 5 is a sectional view taken along line II-II' of FIG. 3. Referring to FIGS. 3 to 5, a plurality of active regions ACT are disposed on a semiconductor substrate 100. The active regions ACT are arrayed as spaced apart from each other by a determined or set interval, with a determined or set width along a first direction and a length along a second direction that intersects with the first direction. It should be understood that any determined, set or certain interval or width as hereinafter mentioned may be appropriately chosen during manufacturing of the device. The active regions ACT are formed as being doped with impurity of a high density, such as N-type impurity for example.

A plurality of memory cells 50a and dummy cells 50b are individually disposed on the respective active regions ACT. The plurality of memory cells 50a are disposed as being spaced apart from each other by a determined or set interval in the second direction, on each active region ACT. In the first direction, at least one dummy cell 50b is disposed after every determined or set number of memory cells 50a. It should be understood that any determined, set or certain number of memory cells as hereinafter mentioned may be appropriately chosen during manufacturing of the device.

The dummy cells 50b have the same structure as the memory cells 50a. As previously described, at least one dummy cell 50b is disposed in the first direction every certain number of memory cells 50a. In the second direction, the dummy cells 50b are disposed mutually adjacent to each other. For example, a plurality of dummy cells 50b are disposed spaced apart from each other by a determined or set interval in the second direction on a corresponding active region ACT among the active regions ACT. The dummy cells 50b are disposed to adjust a step coverage with adjacent memory cells 50a, so as to dispose a global word line GWL on the dummy cells 50b.

Each of the memory cells 50a and the dummy cells 50b has a structure that one diode D and a variable resistant element GST are connected. For example, on the active region ACT, a cathode region (c) and an anode region (a) of the diode D are disposed in a vertical direction with respect to semiconductor substrate 100, the anode region (a) being formed on the cathode region (c). The diode D may be formed by selective epitaxial growth (SEG) for example. A bottom electrode contact (BEC) is formed on the diode D, to electrically connect the diode D with the variable resistant element GST. The variable resistant element GST formed of phase change material is disposed on the BEC. Conductive layers L1, L2 and L3 for disposition of signal lines are formed at the upper part above the memory cells 50a and the dummy cells 50b.

Local bit lines LBL are disposed in a first conductive layer L1 as a lowermost layer among the conductive layers L1, L2 and L3. The local bit lines LBL are connected to the variable resistant elements GST constituting the memory cells 50a through top electrode contacts TEC. In the first conductive layer L1, the local bit lines LBL are arrayed apart from each other by a determined or set interval, and extend along the first direction as a length direction. That is, the local bit lines LBL have length that extends in the first direction, and that intersects with the length direction of the active regions ACT. The local bit lines LBL are connected with, and superimposed over memory cells 50a vertically with respect to the semiconductor substrate 100, through the respective contacts TEC. Local bit lines LBL are electrically disconnected from the dummy cells 50b at the superimposed portions.

Local word lines LWL and global word lines GWL are disposed in a second conductive layer L2 provided as a layer above the first conductive layer L1. The local word lines LWL are arrayed as being spaced apart from each other, and as extending in the second direction as a length direction. The local word lines LWL are coupled with the active regions ACT through respective contacts C0. In other words, the local word lines LWL extend lengthwise in the same direction as a length direction of the active regions ACT, and are disposed to be superimposed above the memory cells 50a in a vertical direction with respect to the semiconductor substrate 100, but not to be superimposed above the dummy cells 50b. The local word lines LWL are disposed to obtain high-speed operation, since resistance of the active regions ACT if used as local word lines would be large.

The global word lines GWL are arrayed as being spaced apart from the local word lines LWL and as superimposed above the dummy cells 50b, in the second conductive layer L2. The global word lines GWL extend lengthwise in the second direction that is the same as the direction that the local word lines LWL extend. The global word lines GWL are formed as superimposed over the dummy cells 50b in a vertical direction with respect to the semiconductor substrate 100, and are electrically disconnected from the dummy cells 50b. Herewith, the global word lines GWL are provided fewer in number than that of the local word lines LWL, and may be disposed in a structure so that at least one is respectively disposed after every certain or set number of local word lines LWL. The local word lines LWL and the global word lines GWL may be formed through the same process, thus simplifying the manufacturing process.

In a third conductive layer L3 provided above the second conductive layer L2, global bit lines GBL are arrayed as separated from each other by a determined or set interval, and extend lengthwise in the first direction. The global bit lines GBL are provided fewer in number than that of the local bit lines LBL. One global bit line GBL may be disposed as being superimposed over any one of every certain or set number of local bit lines LBL, in a vertical direction with respect to the semiconductor substrate 100. The word lines GWL and LWL, and the bit lines GBL and LBL, may be formed of metal material having a prominent electrical conduction.

In a layout structure of a semiconductor memory device according to this exemplary embodiment of the invention as described above, local bit lines LBL are disposed in a first conductive layer L1 that is formed on memory cells 50a and dummy cells 50b of a diode structure; and in a second conductive layer L2, local word lines LWL and global word lines GWL are disposed; and global bit lines GBL are disposed in a third conductive layer L3, thus obtaining a hierarchical structure. Such a hierarchical structure is realized, thus providing high integration, high speed and high performance.

Figure 6:
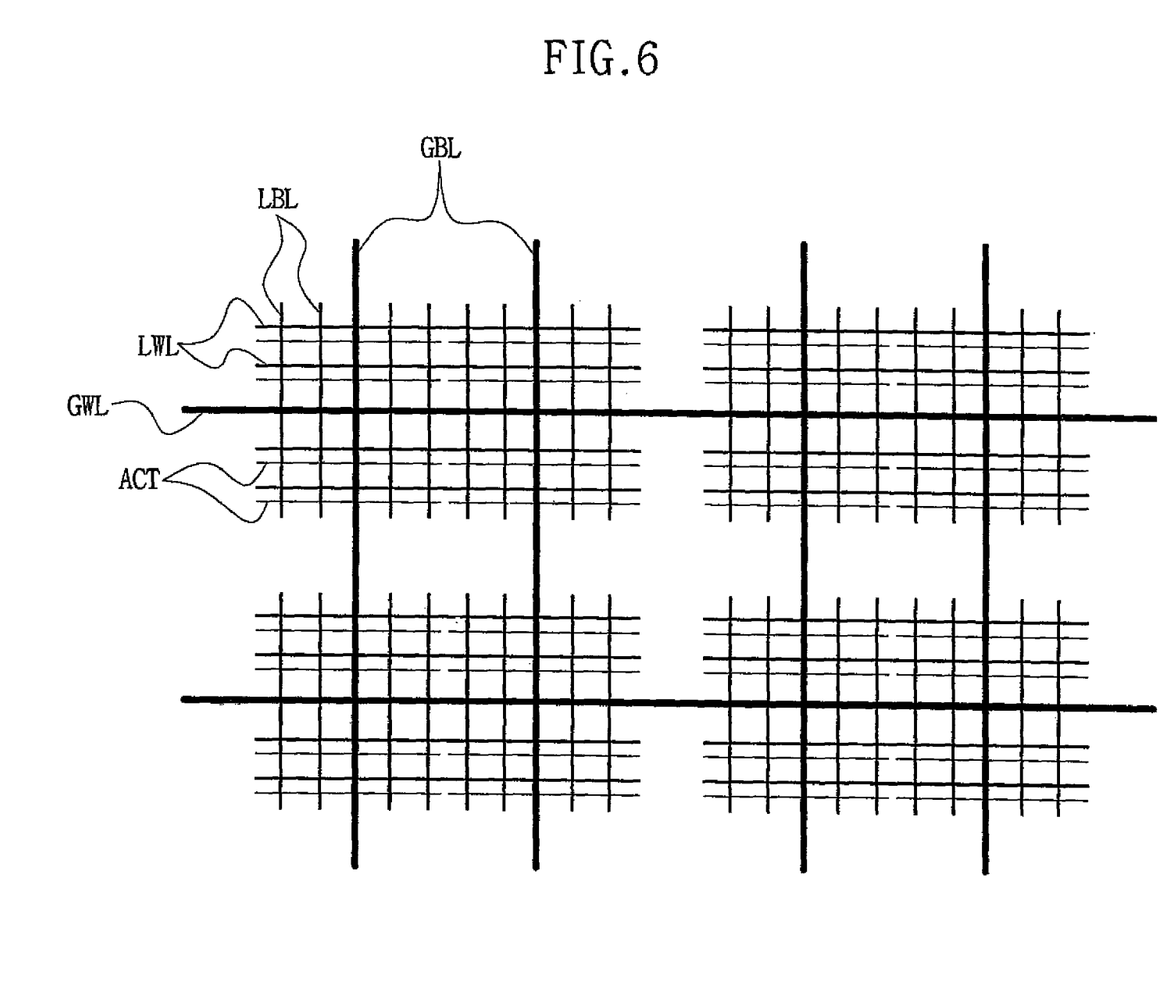
FIG. 6 illustrates a layout of semiconductor memory device according to another exemplary embodiment of the invention.

FIG. 6 illustrates a layout of a semiconductor memory device according to another exemplary embodiment of the invention. FIG. 6 illustrates only a layout of signal lines disposed in an upper part of a memory cell, in order to represent in detail a layout structure of the lines. In case signal lines are actually mutually superimposed, the drawings shows them as having mutual adjacent shape for a distinction.

As shown in FIG. 6, according to another exemplary embodiment of the invention, global word lines GWL, local word lines LWL, global bit lines GBL and local bit lines LBL constitute a semiconductor memory device. The word lines including the global word lines GWL and the local word lines LWL are row lines. The bit lines including the global bit lines GBL and the local bit lines LBL are column lines. The word lines GWL and LWL, and the bit lines GBL and LBL, are arrayed as intersecting with each other.

The word lines including the global word lines GWL and the local word lines LWL, and the bit lines including the global bit lines GBL and the local bit lines LBL, are all positioned individually as conductive layers on at least three layers. That is, the lines are disposed at least among three different conductive layers. At one of the conductive layers, the bit lines GBL and LBL are disposed together in parallel. In other words, bit lines GBL and LBL are disposed at one conductive layer provided on active regions ACT that constitute a semiconductor substrate. Also, at a conductive layer above the conductive layer in which the bit lines GBL and LBL are formed, the local word lines LWL are disposed. Then, above the conductive layer where the local word lines LWL are disposed, global word lines GWL can be disposed.

Figure 7:
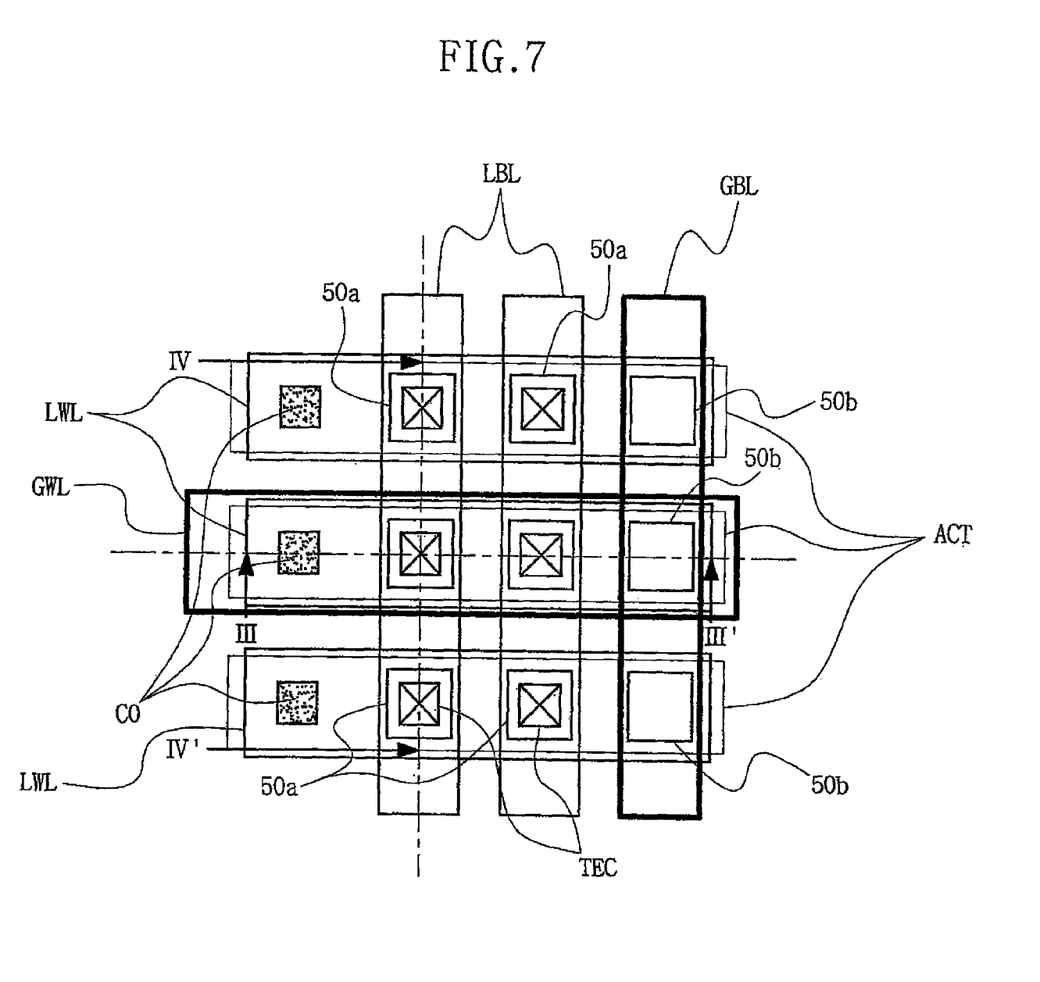
FIG. 7 illustrates a partially enlarged view of FIG. 6.
Figure 8:
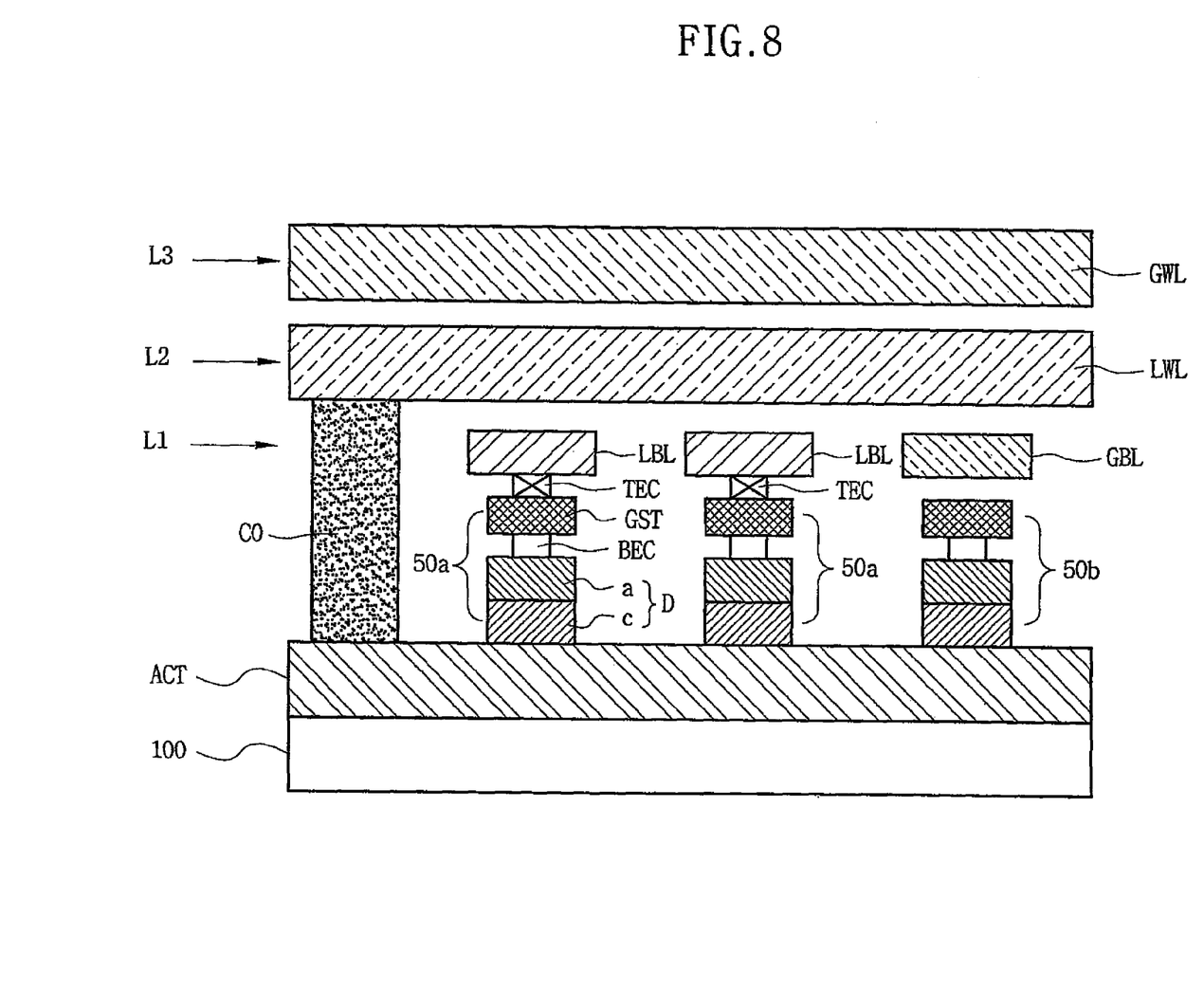
FIG. 8 is a cross-sectional view taken along line III-III' of FIG. 7.
Figure 9:
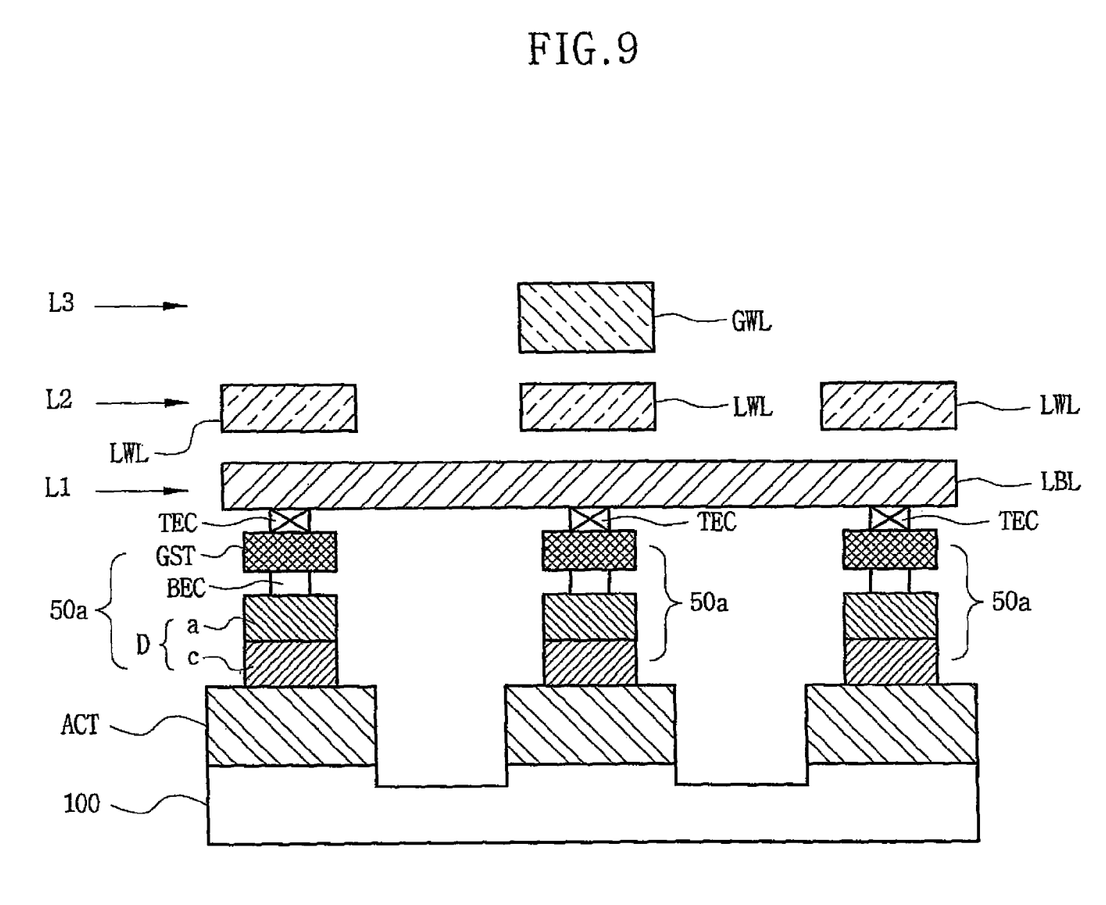
FIG. 9 is a cross-sectional view taken along line IV-IV' of FIG. 7.

FIG. 7 illustrates a partially enlarged view of FIG. 6. FIG. 8 is a cross-sectional view taken along line III-III' of FIG. 7. FIG. 9 is a cross-sectional view taken along line IV-IV' of FIG. 7. Referring to FIGS. 7 to 9, a plurality of active regions ACT are disposed on a semiconductor substrate 100. The active regions ACT are arrayed as being spaced from each other by a determined or set interval, with a determined width along a first direction and a length along a second direction that intersects with the first direction. The active regions ACT are formed as being doped with impurity of a high density, such as N-type impurity for example.

A plurality of memory cells 50a and dummy cells 50b are disposed on the active regions ACT. Plural memory cells 50a are spaced apart from each other, and at least one dummy cell 50b is disposed after every determined or set number of memory cells 50a in the second direction, on each active region ACT. In the first direction, the memory cells 50a are disposed adjacent to one another as spaced apart by a determined or set interval.

The dummy cells 50b have the same structure as the memory cells 50a. The dummy cells 50b are disposed adjacent to one another as spaced apart a determined or set interval in the first direction, and at least one dummy cell 50b is disposed every certain or set number of memory cells 50a in the second direction. The dummy cells 50b are disposed to adjust a step coverage with adjacent memory cells 50a, in order to dispose global bit lines GBL on the dummy cells 50b.

Each of the memory cells 50a and the dummy cells 50b has a structure that one diode D and a variable resistant element GST are connected. For example, on the active region ACT, a cathode region (c) and an anode region (a) of the diode D are disposed in a vertical direction with respect to the semiconductor substrate 100, the anode region (a) being formed on the cathode region (c). The diode D may be formed by selective epitaxial growth (SEG) for example. A bottom electrode contact (BEC) is formed on the diode D, to electrically connect the diode D with the variable resistant element GST. The variable resistant element GST formed of phase change material is disposed on the BEC. Conductive layers L1, L2 and L3 for disposition of signal lines are formed over the memory cells 50a and the dummy cells 50b.

Local bit lines LBL are disposed in a first conductive layer L1 as a lowermost layer among the conductive layers L1, L2 and L3. The local bit lines LBL are connected with the variable resistant elements GST, through respective top electrode contacts TEC, each of the variable resistant elements GST constituting respective ones of the memory cells 50a. In the first conductive layer L1, the local bit lines LBL are arrayed as being spaced apart from each other, and extending in the first direction as a length direction. That is, the local bit lines LBL are disposed as extending lengthwise in a direction that intersects with the length direction of the active regions ACT. The local bit lines LBL are connected with memory cells 50a over which they are superimposed vertically with respect to the semiconductor substrate 100, through respective contacts TEC. The local bit lines LBL are not superimposed over dummy cells 50b, and are electrically disconnected from the dummy cells 50b.

A plurality of global bit lines GBL are disposed in the first conductive layer L1 as vertically superimposed over the dummy cells 50b. In the first conductive layer L1, the global bit lines GBL are spaced from the local bit lines LBL, and are arrayed as extending lengthwise along the first direction the same as the local bit lines LBL. At least one of the global bit lines GBL is disposed every determined or set number of local bit lines LBL. The global bit lines GBL may be provided fewer in number than that of the local bit lines LBL. The local bit lines LBL and the global bit lines GBL may be formed through the same process, thus simplifying the manufacturing process.

In a second conductive layer L2 provided above the first conductive layer L1, local word lines LWL are disposed. The local word lines LWL are arrayed as being spaced from one another by a determined or set interval, and as extending in the second direction as a length direction. The local word lines LWL are respectively connected with the active regions ACT through contacts C0. The local word lines LWL extend lengthwise in the second direction the same as a length direction of the active regions ACT, and are superimposed over the active regions ACT in a vertical direction with respect to the semiconductor substrate 100. The local word lines LWL are disposed to obtain high-speed operation, since resistance of the active regions ACT if used as local word lines would be large.

In a third conductive layer L3 adjacent over the second conductive layer L2, a plurality of global word lines GWL are arrayed spaced apart from each other by a determined or set interval, and as extending lengthwise in the second direction. The global word lines GWL are provided fewer in number than that of the local word lines LWL. One global word line GWL may be disposed as being superimposed over any one of every certain number of local word lines LWL, in a vertical direction with respect to the semiconductor substrate 100. The word lines GWL and LWL, and the bit lines GBL and LBL, may be formed of metal material having a prominent electrical conduction.

As described above, in a layout structure of a semiconductor memory device according to this exemplary embodiment of the invention, local bit lines LBL and global bit lines GBL are disposed in a first conductive layer L1 positioned over memory cells 50a and dummy cells 50b having a diode structure; and in a second conductive layer L2, local word lines LWL are disposed; and in a third conductive layer L3, global word lines GWL are disposed, thereby obtaining a hierarchical structure. Accordingly, in a PRAM, such a hierarchical structure is realized, to thus provide a high integration, high speed and high performance.

Figure 10:
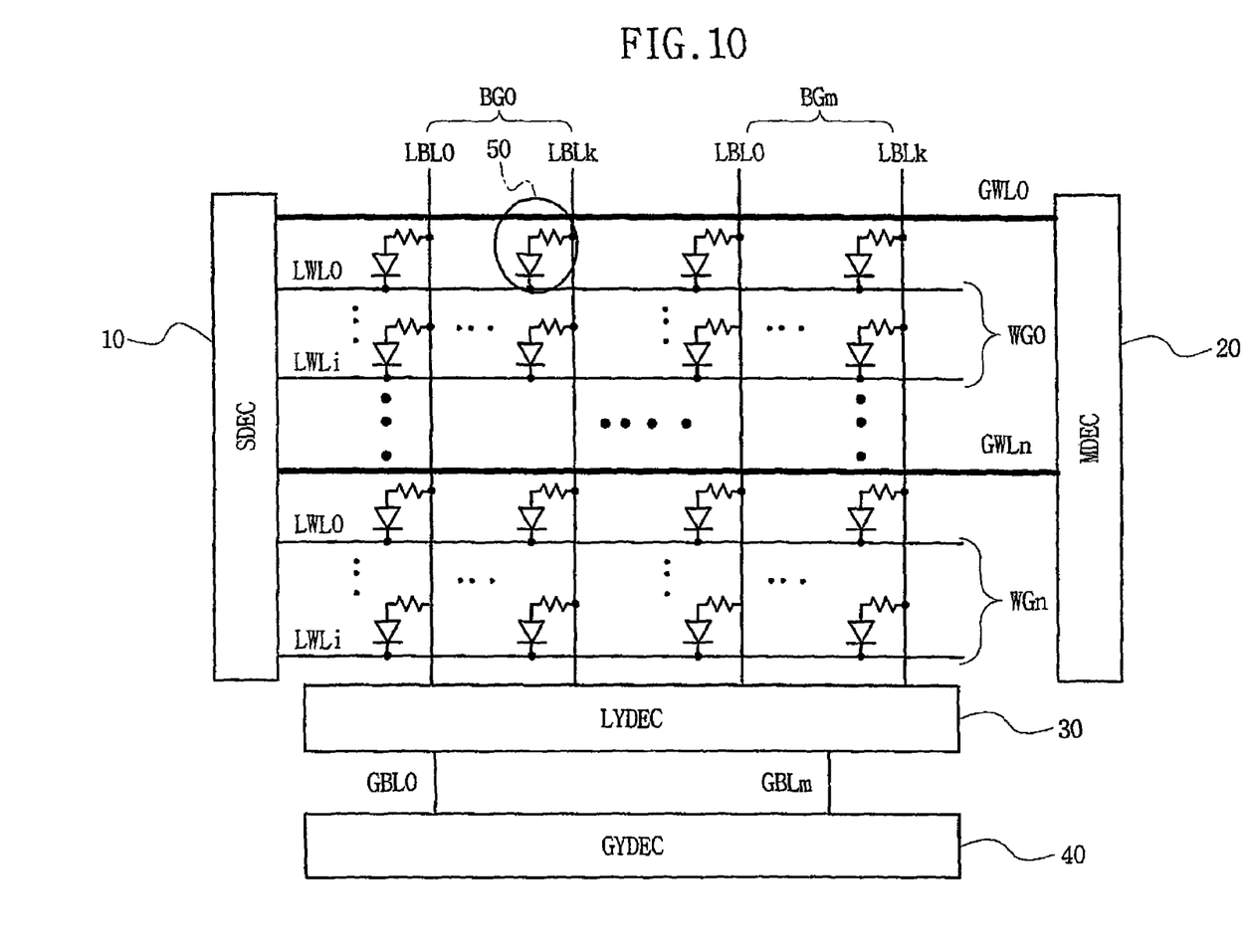

FIG. 10 schematically illustrates an example of an equivalent circuit of a semiconductor memory device to which the layout structures as described with respect to FIGS. 2-9 may be applied, according to another exemplary embodiment of the invention. Referring to FIG. 10, a semiconductor memory device according to this exemplary embodiment of the invention includes memory cells 50, global bit lines GBL (GBL0 to GBLm; m being a natural number of not less than 1), local bit lines LBL (LBL0 to LBLk; k being a natural number of not less than 1), global word lines GWL (GWL0 to GWLn; n being a natural number of not less than 1), local word lines LWL (LWL0 to LWLi; i being a natural number of not less than 1), a main row decoder MDEC 20, a sub row decoder SDEC 10, a local column decoder LYDEC 30, and a global column decoder GYDEC 40. The semiconductor memory device may have a multi bank structure or multi mat structure well known to those skilled in the art of the invention.

The main row decoder 20 is called a global row decoder, and the sub row decoder 10 is called a local row decoder. The global column decoder 40 is called a main column decoder, and the local column decoder 30 is called a sub column decoder. The row decoders 10 and 20 may be considered as including a word line driver circuit.

The memory cells 50, the global bit lines GBL, the local bit lines LBL, the global word lines GWL and the local word lines LWL may have a layout structure referred to in FIGS. 2-5, or a layout structure referred to in FIGS. 6-9. Further, as shown in FIG. 10, the number of local bit line groups BG0 to BGm of which each is constructed of a plurality of local bit lines LBL0 to LBLk, may be the same as the number of the global bit lines GBL, whereby the local bit line groups BG0 to BGm being selectively connected to any one of global bit lines GBL. The number of local word line groups WG0 to WGn of which each is constructed of a plurality of local word lines LWL0 to LWLi, may be the same as the number of the global word lines GWL, the plurality of local word lines LWL0 to LWLi being controlled by any one of global word lines GWL.

Each of the memory cells 50 has a diode structure referred to in FIG. 1. Each of the memory cells 50 is connected directly to any one of local bit lines LBL as column lines, and is connected directly to any one of local word lines LWL as row lines. The memory cells 50 are selected by an enabling of local bit lines LBL and local word lines LWL connected respectively to the memory cells 50. For example, when the encircled memory cell 50 shown in FIG. 10 is selected, a kth local bit line LBLk of a first local bit line group BG0 and a first local word line LWL0 of a first local word line group WG0 are enabled.

The main row decoder 20 performs a control to enable any one of global word lines GWL0 to GWLn in response to a row address signal applied from the outside. When one of the global word lines GWL0 to GWLn is enabled, the sub row decoder 10 performs a control to enable any one of local word lines LWL0 to LWLi in response to an address signal and an enable signal of the enabled global word line. For example, when a first global word line GWL0 is enabled, one of a plurality of local word lines LWL0 to LWLi within a first local word line group WG0 shown in an upper part of FIG. 10 is enabled. When an nth global word line GWLn is enabled, one of a plurality of local word lines LWL0 and LWLi within an nth local word line group WGn shown in a lower part of FIG. 10 is enabled.

The local column decoder 30 provides control to selectively connect one of local bit lines LBL0 to LBLk individually coupled with a plurality of memory cells 50, with one of global bit lines GBL0 to GBLm, in response to a column address signal, thereby controlling a transmission of data during a read or write operation. For example, one of a plurality of local bit lines LBL0 to LBLk within a first local bit line group BG0 shown to the left of FIG. 10 may be selectively connected to a first global bit line GBL0; and one of a plurality of local bit lines LBL0 to LBLk within an mth local bit line group BGm shown to the right of FIG. 10 may be selectively connected to an mth global bit line GBLm. The global column decoder 40 provides control to selectively connect one of the global bit lines GBL0 to GBLm with a data line (not shown) or sense amplifier (not shown) in response to a column address signal.

As described above, in a semiconductor memory device according to an exemplary embodiment of the invention, a global word line GWL, a local word line LWL, a local bit line LBL and a global bit line GBL are driven, thereby obtaining a hierarchical structure through which data stored in a selected memory cell is read or data is written.

Though the exemplary embodiments of the invention were described only with respect to PRAM, a layout structure in a semiconductor memory device and a layout method therein can be applied to other semiconductor memory devices such as MRAM (Magnetic Random Access Memory), FRAM (Ferroelectric Random Access Memory), DRAM or other volatile or nonvolatile memory, through some variations or applications, in a cell structure having the same as or similar to the above-described cell structure.

As described above, according to exemplary embodiments of the invention, memory cells and dummy cells are disposed with a determined interval in a layout of the semiconductor memory device, and at least three conductive layers are formed, whereby a global word line and a local word line are disposed together, or a global bit line and a local bit line are disposed together, to thus obtain simplification of the manufacturing process and an improved hierarchical structure. Accordingly, semiconductor memory devices can be realized so as to advantageously have high integration, high speed and high performance.

It will be apparent to those skilled in the art that modifications and variations can be made in the present invention without deviating from the spirit or scope of the invention. Thus, it is intended that the present invention cover any such modifications and variations of this invention provided within the scope of the appended claims and their equivalents. For example, a plurality of wires or lines may be disposed on more than three plural conductive layers, even though four wires or lines (global bit line, local bit line, global word line and local word line) were described as disposed on three conductive layers provided in the exemplary embodiments of the invention. Accordingly, these and other changes and modifications are seen to be within the true spirit and scope of the invention as defined by the appended claims.

What is claimed is:

1. A layout method in a semiconductor memory device, comprising:
   disposing a plurality of memory cells and dummy cells having a same structure, wherein at least one of the dummy cells is arranged among a number of memory cells on each one of a plurality of active regions, the plurality of active regions being spaced apart from each other by a set interval on a semiconductor substrate; and
   disposing a set of local bit lines at a first conductive layer among at least three conductive layers sequentially stacked above the plurality of memory cells and dummy cells,
   disposing a set of local word lines and a global word line at a second conductive layer above the first conductive layer, wherein the global word line is arranged between adjacent ones of the set of local word lines; and
   disposing global bit lines at a third conductive layer above the second conductive layer.

2. The layout method of claim 1, wherein disposing the plurality of memory cells and dummy cells comprises:
   disposing diodes at a defined interval, coupled to and on the active regions; and
   respectively disposing variable resistant elements coupled to and on the diodes through contacts.

3. The layout method of claim 2, wherein the variable resistant elements are formed of phase change material.

4. The layout method of claim 1, wherein
   the local bit lines are spaced apart from each other in the set of local bit lines by a first interval and extend in a first direction;
   the local word lines in the set of local word lines with the global word line are spaced apart from each other by a second interval and extend in a second direction that intersects with the first direction; and
   the global bit lines are spaced apart from each other by a third interval and extend in the first direction.

5. The layout method of claim 4, wherein the global bit lines are fewer in number than the local bit lines, and the global bit line is vertically superimposed over one of the local bit lines.

6. The layout method of claim 5, wherein the local bit lines are respectively connected with and vertically superimposed over the variable resistant elements through first respective contacts, and the local word lines are respectively connected with and vertically superimposed over the active regions through second respective contacts.

7. The layout method of claim 6, wherein the global word lines are respectively and vertically superimposed over the dummy cells.

* * * * *